United States Patent [19]

Noble et al.

[11] Patent Number: 4,996,427

[45] Date of Patent: Feb. 26, 1991

[54] IMAGER FOR SIMULTANEOUSLY OBTAINING TWO IMAGES OF DIFFERING COLOR BANDS USING A SINGLE PHOTODETECTOR AREA ARRAY

[75] Inventors: Milton L. Noble, Liverpool; Albert F. Milton, Syracuse, both of N.Y.

[73] Assignee: General Electric Company, Syracuse, N.Y.

[21] Appl. No.: 456,498

[22] Filed: Dec. 26, 1989

[51] Int. Cl.$^5$ .............................................. H01L 31/00
[52] U.S. Cl. .................................... 250/332; 250/226; 250/339; 250/370.08; 250/370.06
[58] Field of Search ................... 250/339, 332, 370.06, 250/226, 349, 352, 370.08, 370.15

[56] References Cited

U.S. PATENT DOCUMENTS

| | | | |
|---|---|---|---|
| 4,423,325 | 12/1983 | Foss | 250/332 |
| 4,519,707 | 5/1985 | Kuffer | 250/339 |
| 4,737,642 | 4/1988 | Steil et al. | 250/332 |
| 4,746,798 | 5/1988 | Amon et al. | 250/339 |

Primary Examiner—Carolyn E. Fields

Attorney, Agent, or Firm—Richard V. Lang; Paul Checkovich; Fred Jacob

[57] ABSTRACT

The invention relates to an imager for simultaneously obtaining two images of differing color bands of the same object field using a single two dimensional photodetector array. A Fresnel-biprism with two different color filters on the respective left and right aperture halves convergently displaces the two images. An objective lens focuses the filtered convergent images upon a photodector array, the left and right halves of which are covered by a second filter pair. The second pair of filters pass the same color bands as the first pair of filters but the order of the color bands bands is reversed from left to right. As a result of the filtering and convergence, the photodetector array, aligned with its columns parallel to the filter boundaries, responds with its left half to one color image and with its right half to the other color image. The arrangement provides two color band operation without resorting to a second photodetector array, or duplicate read out electronics, and when used in the IR spectrum avoids the need for additional cryogenic apparatus.

2 Claims, 3 Drawing Sheets

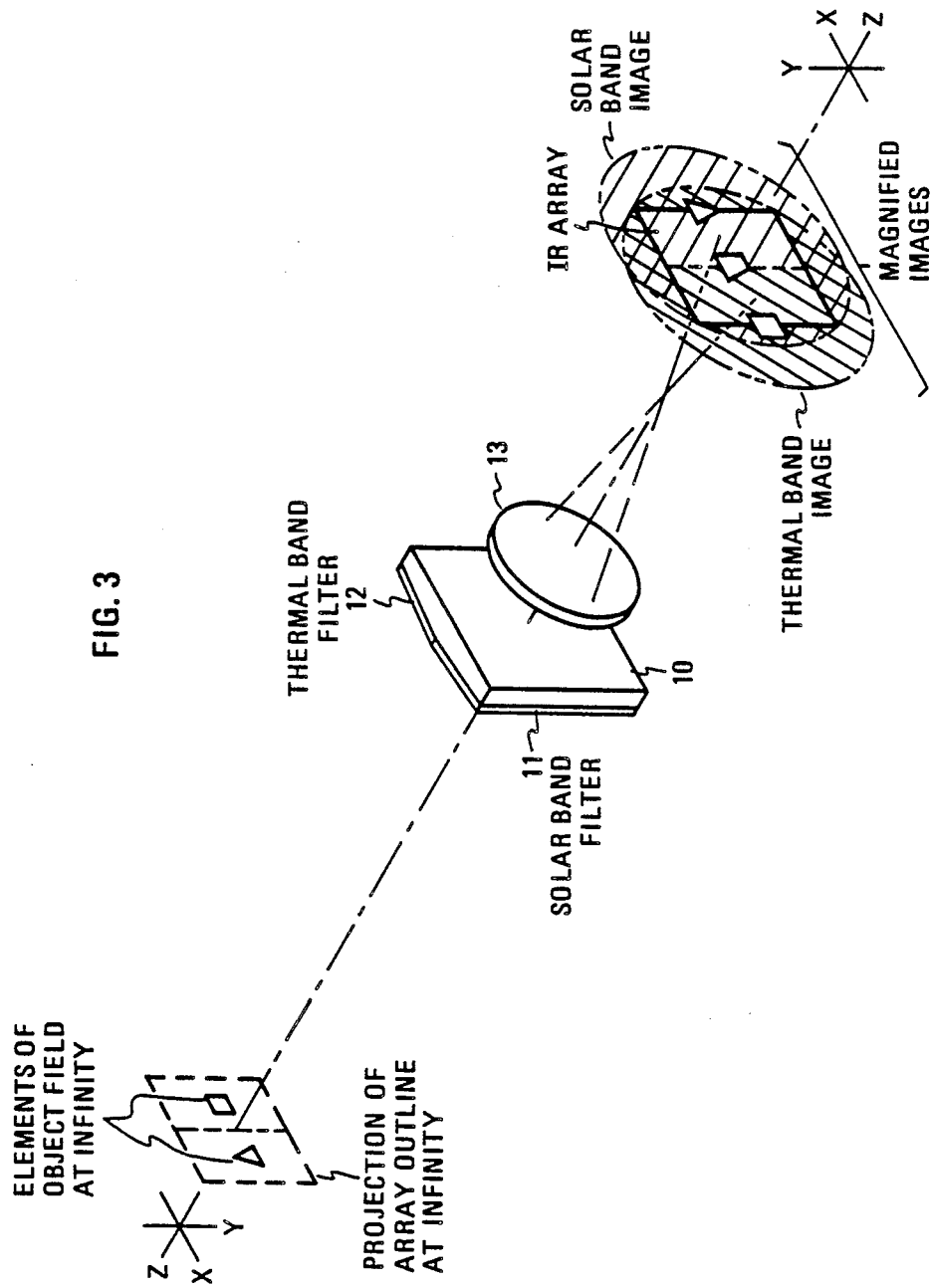

FIG. 4A OBJECT FIELD AT INFINITY
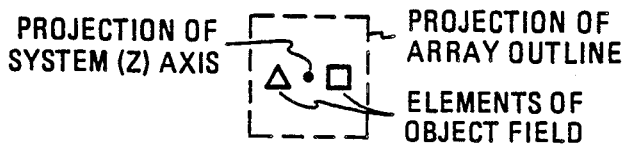
FIG. 4B IMAGE AT FOCAL PLANE WITHOUT BIPRISM AND FILTERS
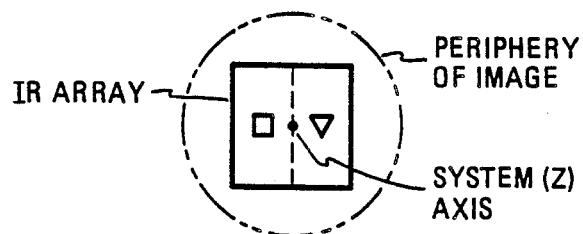
SEPARATE IMAGES WITH BIPRISM 10 AND FILTERS 11 AND 12
(BUT WITHOUT FILTERS 20 AND 21)
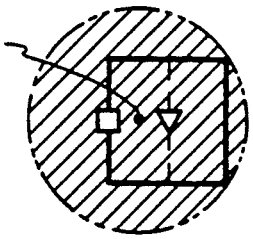
FIG. 4C
THERMAL
BAND IMAGE
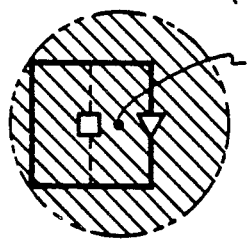
FIG. 4D
SOLAR BAND
IMAGE
SEPARATE IMAGES WITH BIPRISM 10 AND FILTERS 11, 12, 20 AND 21
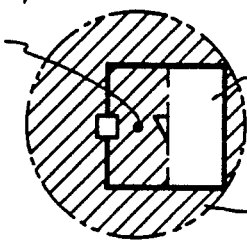
FIG. 4E
THERMAL
BAND IMAGE
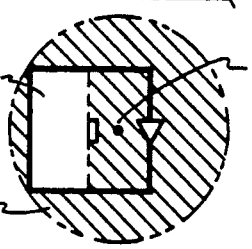
FIG. 4F
SOLAR BAND
IMAGE

IMAGER FOR SIMULTANEOUSLY OBTAINING TWO IMAGES OF DIFFERING COLOR BANDS USING A SINGLE PHOTODETECTOR AREA ARRAY

BACKGROUND OF THE INVENTION

1. Field of the Invention

The invention relates to two color imagers, and more particularly to an imager for simultaneously obtaining two images of differing color bands of the same object field using the same two dimensional photodetector array.

The invention, which utilizes a photodetector array operating a staring mode, has application to those portions of the visible and invisible spectrum to which a photodetector array responds, including the infrared (IR) spectrum.

2. Prior Art

In many optical systems applications there is a need to perform two-color imaging. Two color imaging is of substantial importance in applications such as aerial mapping, where both visible and invisible light can play an important part in gathering geological data, determining surface temperatures, vegetation, etc., as well as in infrared systems where it is desirable to recognize an object by a "signature" composed of two color bands in the IR spectrum.

A duplicated system for two color operation in any portion of the spectrum accessible to photodetector arrays is not commercially attractive due to the high cost of an additional staring array, and of additional read out electronics. For IR operation, where an additional dewar/cooler assembly may be needed, the use of a multiple array approach is even more costly. The cost and system complications makes the multiple array approach for two color operation in any portion of the spectrum unattractive.

One known approach for obtaining two color operation from a single area array is that of using color "checkerboard filters", placed in close proximity to the array on the focal plane of an imager. In this approach, pixel level filters may be employed. This approach suffers from several problems. First, the checkerboard filters are expensive to fabricate and due to practical limits on filter design, the spatial transition from one filter element to the next requires an appreciable fraction of the array pixel dimension, even with large pixels (a pitch of 3-4 mils). Consequently, the checkerboard filter reduces the optical fill factor of the array. Mounting the checkerboard filter in close proximity to the array is difficult and adds to the cost of the focal plane due to both added complexity in focal plane array (FPA) assembly and added criticality in the alignment between filter and photodetector array. Pixel level checkerboard filters must be mounted with an accuracy of a fraction of a pixel (often less than 1 mil) with respect to the active surface of the array.

There is, therefore, a need for a simplified means for simultaneously obtaining two-color images using a single area array and requiring neither duplicated readout electronics nor—in the case of operation in the IR spectrum of a duplicated cryogenic environment.

SUMMARY OF THE INVENTION

Accordingly, it is an object of the invention to provide an improved imager for simultaneously obtaining two images of differing color bands of the same object field.

It is another object to provide an improved imager for obtaining two images of differing color bands of the same object field using a single two dimensional photodetector array sensitive to both color bands.

It is still another object to provide an infrared imager for obtaining two images of differing color bands of the same object field while using a single photodetector array, single read out electronics, and a single dewar/cooler.

These and other objects are achieved in accordance with the invention in an imager comprising a biprism upon which radiation from an object field impinges, having two aperture halves with inclined surfaces. Each aperture half of the prism is coated with a filter for a different color band. In a practical embodiment for IR applications, a solar band filter is provided on the left aperture half and a thermal band filter is provided on the right aperture half of the biprism. An objective lens is provided to image the object field upon a photodetector array disposed in the focal plane. In the IR application, the foregoing elements are arranged outside of a cryogenically-cooled dewar.

In the IR application, the cryogenically-cooled, evacuated-dewar encloses the focal plane of the objective lens, and is provided with an IR transparent window for admitting IR radiation. An apertured cold shield, a second pair of IR transmission filters mounted on the photodetector array, and the photodetector array are provided. The second filter pair and the array lie in the focal plane of the objective lens.

The first filter of the second pair, which covers the right half of the photodetector array, selects the solar band image and the second filter of the second pair, which covers the left half of the photodetector array, selects the thermal band image.

With the biprism angle adjusted to translate each color image by one quarter of the photodetector array side dimension, the left half of the photodetector array responds to the thermal band image and the right half of the photodetector array responds to the solar band image.

The arrangement simultaneously provides two images of differing color bands of the same object field on the right and left halves of the same array. No additional array, no additional read out electronics, and (for IR operation) no additional cryogenic apparatus is required.

BRIEF DESCRIPTION OF THE DRAWINGS

The inventive and distinctive features of the invention are set forth in the claims of the present invention. The invention itself, however, taken with further objects and advantages thereof may best be understood by reference to the following description and accompanying drawings, in which:

FIG. 3 is an isometric view of the imager including the object field and the two displaced color images formed upon the imager, FIGS. 4(a) to 4(f) are successive views of the object field and of the images formed or potentially formed in the imager as a result of successive filtering and convergence.

DESCRIPTION OF THE PREFERRED EMBODIMENT

Figure 1:
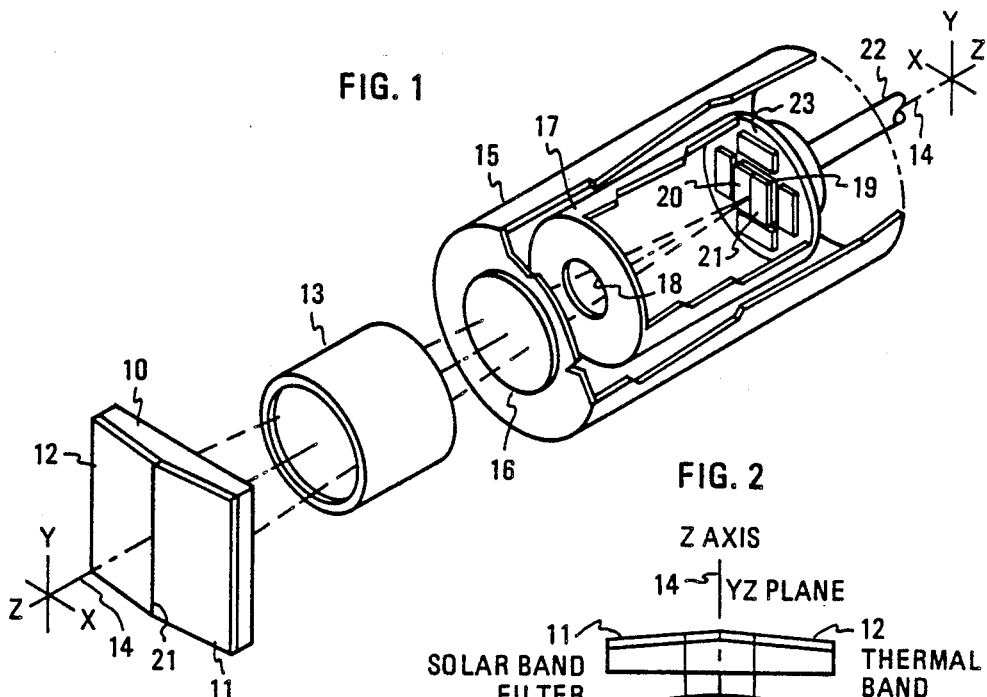
FIG. 1 is a broken away isometric view of an infrared imager for obtaining two images of differing color bands using a single photodetector array in accordance with the invention.
Figure 2:
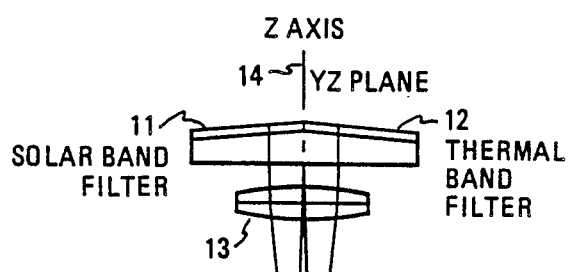
FIG. 2 is a simplified optical schematic of the two color infrared imager.
Figure 5:
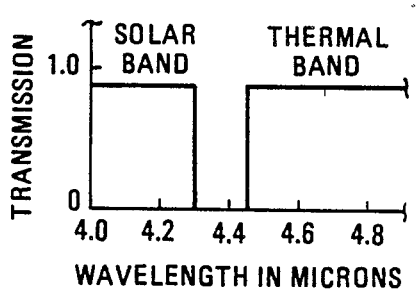
FIG. 5 is an illustration of the color band selection properties of the filters employed in the imager.

A two color infrared (IR) imager in accordance with the invention is shown in FIGS. 1 and 2. The novel arrangement permits separate halves of an IR sensing photodetector array to be used to examine the same field of view, each half responding to a different band of colors selected from the IR spectrum.

Referring particularly to FIG. 1, the imager may be seen to comprise a first portion (10, 12, 13) external to a cryogenic dewar 15 and operated at ambient temperature and a second portion, including the dewar, which contains an IR sensitive photodetector array 19 and associated components (17, 18, 20, 21), which are operated at cryogenic temperatures.

The first portion of the imager consists of a biprism 10, a first pair of color filters 11 and 12 applied to the sloping surfaces of the biprism and an optical objective lens 13, all at ambient temperature. The system relative aperture (i.e., the f number) is established by the lens 13. The field of view is set by the choice of the focal length of the lens and the size of the photodetector array in the focal plane of the lens. In one practical embodiment, the field of view is 4.0°.

The dewar 15 includes an IR transparent window 16 through which IR radiation enters the dewar enclosure. The dewar 15 contains a cold shield 17 provided with a cold aperture 18 for admission of focused infrared radiation for sensing by the IR photodetector array 19. A second pair of IR transmission filters 20 and 21 are provided, each filter being supported over one half of the IR array 19.

The optical elements of the IR imager are aligned in relation to the system axis 14. For positional reference, the system axis coincides with the Z axis, which is assumed to lie in a horizontal plane. The X axis, orthogonal to the Z axis, also lies in a horizontal plane, and as will be seen, extends in the same direction as breadth in the image plane of the objective lens and in the same direction as the rows in the photodetector array 19. The Y axis, orthogonal to the other two, is vertical and extends in the same direction as height in the image plane and in the same direction as the columns in the photodetector array.

The biprism 10 with the attached color filters 11 and 12 are the elements of the optical system nearest to the object field. The biprism 10 is of an IR transmissive material such as germanium. It is typically monolithic in construction. It is in principle a prism, the principal section of which is a triangle with one obtuse and two equal acute angles. As will be seen, it is used to obtain two mutually displaced images of a single object. The biprism is also called a "Fresnel-biprism" denoting its inventor.

The biprism 10 has a plane surface 21 on one face and on the other face, two aperture halves with inclined surfaces. The inclined surfaces, if extended, would meet the plane surface with an acute angle in conformity with the customary definition, but the vertices, where the acute angle would have appeared, are eliminated by the provision of perpendicular walls bounding the prism. The obtuse angle, in the case of a 4° field of view, and assuming an index of refraction of 4 for germanium, is slightly less than 180°, being (180−0.3552°) or 179.6448°.

As seen in FIG. 1, the prism 10, which in the embodiment is of square outline and of sufficient area to cover the entrance aperture of the objective lens 13, is oriented with the sloping aperture halves toward the object field, and the ridge line 21 defining the boundary between aperture halves, vertical, and lying in the YZ plane, which passes through the system axis.

The sloping aperture halves of the prism 10 are coated with two different color selective filters. A filter 11 for selecting IR of a first color band is applied on the left aperture half of the biprism using the FIG. 2 orientation. Its color selective property is illustrated in FIG. 4. In the present embodiment, the filter 11 is selective of the solar band, typically on the short wave side of 4.2 microns. The filter 12 for selecting IR of a second color band is applied to the right aperture half of the biprism. Its color selective property is also illustrated in FIG. 4. It is selective of the thermal band, typically on the long wave side of 4.4 microns.

The biprism may be oriented with the inclined sides toward the object field as shown, or it may be reversed with the flat face toward the object field, either orientation being satisfactory.

The objective lens 13 is of a material suitable for use with IR radiation, and for system sensitivity should have a large relative aperture A suitable focal length is 75 millimeters, assuming a 128×128 pixel array with 1.7 mil pitch giving an area of 0.218×0.218 inches in the focal plane, which provides a nominal 4° field of view, as earlier noted. After passing through the initial pair of color filters 11, 12, the biprism 11 and the objective lens 13, the IR radiation enters the dewar 15 through an IR transparent window 16. To maintain IR sensitivity and exclude unnecessary background radiation from impinging on the photodetector array, an apertured cold shield 17 is provided inside the dewar. An image of the object field is then formed upon the assembly 23 supported in the focal plane of the objective lens.

The cryogenic dewar 15 is of conventional design, being cooled by a cryogenic cooler 22 entering the dewar from the side remote from the objective lens. The focal plane assembly 23 is supported in thermal contact with a "cold finger" of the cooler, which cools the assembly down to the desired low operating temperature (typically near 60°K) The assembly 23 is of a hybrid construction including the staring IR photodetector array 19 at its center with four integrated circuits, required to operate the staring array, surrounding it.

The staring array 19, as earlier suggested, is oriented with the rows running in the X coordinate direction parallel to the XZ plane corresponding to the horizontal in both the object field and in the image plane. The columns on the other hand run vertically and parallel to the YZ plane. The staring array is set behind a second pair of filters 20 and 21, which are applied respectively over the right and left halves of the focal plane array (using FIG. 2 orientations). Each filter thus covers nearly 64 columns excluding loss due to the joint. Each column contains 128 photodetectors and the boundary lies in the YZ plane. The Z axis ideally impinges between the 64$^{th}$ and 65$^{th}$ pixels in the YZ plane.

The second filter pairs 20, 21 must be compatible with the first filter pair 11, 12. In one practical embodiment, the filters 11 and 20 have the same color selective property (i.e. solar band), rejecting all other colors in the IR band, and the filters 12 and 21 have the same color selective property (i.e. thermal band), rejecting all other colors in the IR band.

The operation of the two color imager in providing two mutually displaced images of the same object field of a first and a second color respectively, may best be understood by reference to FIGS. 2, 3 and 4(a) to 4(f). FIG. 2 is a simplified optical schematic of the imager, with FIG. 3 being an isometric view the object field and of the images formed by the imager optics. For illustrative purposes in FIGS. 3 and 4(a)-4(f) an object field is shown, using a separate symbol (triangle and square) to differentiate the left and right halves. FIGS. 4(a) to 4(f) illustrates how the two color images formed at the photodetector array are affected by the intervening filter pairs (11-12; 20-21) and the biprism 10. The system axis (Z) is used for reference purposes in each of these figures.

The incident rays of IR radiation from a distant object arrive in a parallel condition at the two color sensor input aperture. Assuming the objective lens 13 to be present, and the two filter pairs (11-12; 20-21) and the biprism 10 to be absent, a selected portion of the field of view is imaged upon the photodetector array. (This may be called the "broadband image".) The broadband image, which is shown at 4(b) contains all the colors (e.g. wavelengths) transmitted by the optical elements 13 and 16 and its extent is defined by the circular outline. The photodetector array is here shown as a bold-faced square. A smaller square and an inverted triangle, respectively, not bold-faced, have been used to designate the left and right-hand halves of the image at the focal plane. The image normally extends beyond the limits of the photodetector array. The projection of the system (Z) axis and the projection of the square outline of the photodetector array upon the object field at infinity are shown in FIGS. 3 and 4(a).

Assuming the biprism 10 and filters (11-12; 20-21) to be absent, the objective lens 13 forms a simple full color image of the object field upon the photodetector array 19 in the focal plane of the lens. The object field is shown in FIG. 4(a) and its image field is shown in FIG. 4(b). In FIG. 4(b), the photodetector array 19 is shown centered on the system (Z) axis and covering only a portion of the image field.

When the biprism 10 and filters 11,12 are inserted in the optics, then each aperture-half of the filter prism combination simultaneously forms a displaced image of a different color over the area sensed by the photodetector array. This effect is illustrated in FIGS. 4(c) and 4(d), which are drawn assuming that the separate color band images have not yet being passed through the filters 20,21 applied to the surface of the photodetector array 19. In FIG. 4(c), the thermal band image is displaced to the left of the system (Z) axis and in FIG. 4(d) the solar band image is displaced to the right of the system (Z) axis. The "dots" in FIGS. 4(c) and 4(d) indicate the positions of the axes of the thermal and solar band images.

The effect of the array filters 20,21 in completing the separation of the two mutually displaced color images is shown in FIGS. 4(e) and 4(f). After passing through the thermal band array filter 21, the thermal band image, which is displaced to the left, is formed on the left half of the photodetector array. As shown in FIG. 4(e), the filter 21, which covers the left half of the array, passes the thermal image while filter 20, which covers the right half of the array, rejects the thermal image on the right half of the photodetector array. Likewise, the solar image, displaced to the right, is formed on the right half of the photodetector array as shown in FIG. 4(f). The solar band array filter 20 passes the solar image to the right half of the array while filter 21 rejects the solar image on the left half of the array. The positions of the thermal and solar band image axes are shown by "dots" in FIGS. 4(e) and 4(f).

The final effect of the sequence is shown in FIG. 3 where identical half portions of the full image of respectively the first and second color bands (i.e. the solar and thermal bands) are formed on the separate right and left halves of the array with no portion of the margins of the real image being sensed by the array. Accordingly, FIG. 3 illustrates the final state of two displaced and filtered images as sensed at the photodetector array.

The arrangement requires careful alignment with the center of each half portion of the full image being positioned such that each displaced color image center falls at the same row position and at the correct column position. In the case of a 128 × 128 array, the system axis is positioned between the $64^{th}$ and $65^{th}$ rows, and the displaced thermal image optic axis is located between the $32^{nd}$ and $33^{rd}$ columns, and the displaced solar image optic axis is located between the $96^{th}$ and $97^{th}$ columns. This requires precision in the formation of the obtuse angle of the biprism, in relation to the focal length of the objective lens 13, and in the overall optic alignment.

In a two dimensional photodetector array of the charge injection device (CID) variety it is conventional to read out each column in parallel. The read out of the array in such CIDs is usually simplified if the YZ axis bisecting the array is oriented parallel to the columns, thus facilitating independent adjustment of the read out electronics for the halves of the array responding to different colors.

What is claimed is:

1. An IR imager for simultaneously obtaining images of differing color bands of the same object field using a single two dimensional photodetector array, comprising:

(A) optical means at ambient temperature, comprising:

(1) a biprism positioned upon the Z axis of said imager, mutually orthogonal X and Y axes being orthogonal to said Z axis, said biprism upon which IR radiation from an object field of view impinges having on one face a plane surface and on the opposite face, two aperture halves with inclined surfaces separated by the YZ plane, the angles thereof being selected to converge IR radiation from each aperture half toward the YZ plane by a predetermined amount, (2) a first pair of IR transmission filters, one filter for selecting IR radiation of a first color band from the radiation passing through a biprism aperture half on the first side of said YZ plane, and the other filter for selecting IR radiation of a second color band from radiation passing through a biprism aperture half on the second side of said YZ plane, (3) an objective lens arranged upon said imager (Z) axis for forming an image of the object field in said first and second color bands on a photodetector array disposed in the focal plane, and (B) a cryogenically cooled evacuated dewar enclosing the focal plane of said objective lens, and having an IR transparent window arranged upon said imager (Z) axis for admitting IR radiation into said dewar, said dewar containing
  (1) a "cold shield" having a cold aperture arranged upon said imager (Z) axis between said objective lens and said focal plane,
  (2) a second pair of IR transmission filters, the first filter which intercepts radiation impinging on the portion of the photodetector array lying on the second side of the YZ plane for selecting IR of said first color band and the second filter intercepting radiation impinging on the portion of the photodetector array lying on the first side of the YZ plane for selecting IR of said second color band; and
  (3) a single two dimensional IR photodetector array arranged upon said imager (Z) axis in said focal plane, with the YZ plane bisecting said array, one pair of sides of which are aligned parallel to the X coordinate dimension,
the predetermined amount of convergence displacing said color band images in mutually opposite senses by one quarter of the X coordinate dimension of said photodetector array,
said array responding to IR radiation impinging thereon after convergence and after selection by said first and second pairs of filters, the first array half on the first side of the YZ plane responding to said object field in said second color and the second array half on the second side of the YZ plane responding to said object field in said first color.

2. An imager for simultaneously obtaining images of differing color bands of the same object field using a single two dimensional photodetector array, comprising:
  (1) a biprism positioned upon the Z axis of said imager, mutually orthogonal X and Y axes being orthogonal to said Z axis, said biprism upon which radiation from an object field of view impinges having on one face a plane surface and on the opposite face, two aperture halves with inclined surfaces separated by the YZ plane, the angles thereof being selected to converge radiation from each aperture half toward the YZ plane by a predetermined amount,
  (2) a first pair of transmission filters, one filter for selecting radiation of a first color band from the radiation passing through a biprism aperture half on the first side of said YZ plane, and the other filter for selecting radiation of a second color band from radiation passing through a biprism aperture half on the second side of said YZ plane,
  (3) an objective lens arranged upon said imager (Z) axis for forming an image of the object field in said first and second color bands on a photodetector array disposed in the focal plane,
  (4) a second pair of transmission filters, the first filter, which intercepts radiation impinging on the portion of the photodetector array lying on the second side of the YZ plane for selecting radiation of said first color band and the second filter intercepting radiation impinging on the portion of the photodetector array lying on the first side of the YZ plane for selecting radiation of said second color band; and
  (5) a single two dimensional photodetector array arranged upon said imager (Z) axis in said focal plane, with the YZ plane bisecting said array, one pair of sides of which are aligned parallel to the X coordinate dimension,
the predetermined amount of convergence displacing said color band images in mutually opposite senses by one quarter of the X coordinate dimension of said photodetector array,
said array responding to radiation impinging thereon after convergence and after selection by said first and second pairs of filters, the first array half on the first side of the YZ plane responding to said object field in said second color and the second array half on the second side of the YZ plane responding to said object field in said first color.

* * * * *